United States Patent
Abdo et al.

(10) Patent No.: US 8,234,601 B2
(45) Date of Patent: Jul. 31, 2012

(54) TEST PATTERN FOR CONTOUR CALIBRATION IN OPC MODEL BUILD

(75) Inventors: Amr A. Abdo, Hopewell Junction, NY (US); Alexander C. Wei, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 12/780,011

(22) Filed: May 14, 2010

(65) Prior Publication Data

US 2011/0283244 A1    Nov. 17, 2011

(51) Int. Cl.
*G06F 17/50*    (2006.01)
(52) U.S. Cl. .................. 716/55; 716/50; 716/51; 716/54
(58) Field of Classification Search ............... 716/55
See application file for complete search history.

(56) References Cited

U.S. PATENT DOCUMENTS

| | | | |
|---|---|---|---|
| 4,761,560 A | 8/1988 | Glendinning | |
| 7,079,235 B2 | 7/2006 | Lehman | |
| 7,086,031 B2 | 8/2006 | Dulmann et al. | |
| 7,155,698 B1 | 12/2006 | Gennari | |
| 7,627,837 B2 | 12/2009 | Zhang | |
| 2009/0123057 A1* | 5/2009 | Mukherjee et al. | 382/144 |
| 2009/0142675 A1 | 6/2009 | Kim | |
| 2009/0193387 A1 | 7/2009 | Mukherjee et al. | |
| 2010/0005440 A1 | 1/2010 | Viswanathan et al. | |
| 2010/0215273 A1* | 8/2010 | Aksenov et al. | 382/190 |

OTHER PUBLICATIONS

A. B. Kahng et al., "Auxiliary pattern-based optical proximity correction for better printability, timing, and leakage control," J. Micro/Nanolith. vol. 7, No. 1, 2008, 013002.
L. Zhu et al., "Study of the contour-based optical proximity correction methodology," J. Micro/Nanolith. vol. 8, No. 4, 2009, 043005.
International Search Report and Written Opinion Application No. PCT/US2011/030233 filed Mar. 29, 2011.

* cited by examiner

*Primary Examiner* — Paul Dinh
*Assistant Examiner* — Bryce Aisaka
(74) *Attorney, Agent, or Firm* — Yuanmin Cai

(57) ABSTRACT

A method of calibrating a lithographic process model is provided. The method includes providing a test pattern that includes a plurality of shapes; transferring the test pattern onto a photo-mask forming a resist image of the test pattern using the photo-mask; collecting model calibration data from the resist image; and calibrating the lithographic process model using the model calibration data, wherein the plurality of shapes of the test pattern have at least a first shape and a second shape, and distances from an edge of the first shape to an edge of the second shape over a range thereof, when being measured parallel to each other, differ from each other.

20 Claims, 10 Drawing Sheets

TEST PATTERN FOR CONTOUR CALIBRATION IN OPC MODEL BUILD

FIELD OF THE INVENTION

The present invention relates generally to design and manufacturing of integrated circuits. In particular, the present invention relates to system and method of creating test patterns and/or test structures that are suitable for calibrating models used in optical proximity correction.

BACKGROUND

Current state of the art semiconductor integrated circuit manufacturing process usually includes various steps that are organized or grouped into different process modules. One such process module, for example, may include a series of steps that creates a pattern of one or more semiconductor devices on a silicon wafer. In particular, this process module may include a lithographic step during which imprints (usually a collection of polygons) on a photo-mask may be projected, through photo-exposure, onto a photo-sensitive resist ("photo-resist") material that is applied or coated on top of a silicon wafer to create a pattern. Next, the pattern created in the photo-resist material may be transferred or copied down to the underneath silicon wafer through, for example, an etching process as part of another process module that forms semiconductor devices in the wafer.

In general, optical systems currently used in performing photo-exposure or lithographic exposure have certain limitations on achievable feature resolutions. For example, there is always a limit on the size and the number of polygons, measured by density in unit area, that may be satisfactorily transferred from a photo-mask to a silicon wafer with acceptable quality by an optical system. In recent years, despite steady improvement in optical systems, resolutions of these optical systems have not been able to keep up with the increasing demand of manufacturing semiconductor devices of ever smaller feature sizes on a single silicon wafer. Under this circumstance, as an alternative measure to meet the demand for optical system resolution, the concept of Optical Proximity Correction (OPC) was introduced.

In an ideal world, forms of device shapes manufactured on a photo-mask shall truly reflect those to be created or imprinted on a semiconductor wafer. Nevertheless, the concept of an OPC technique is to manipulate or pre-distort forms of device shapes to be manufactured on the photo-mask, as is well known in the art, such that the pre-distorted shapes imprinted on the photo-mask, when being transferred to a semiconductor wafer through photo-exposure and subsequent etching step will eventually produce desired device shapes on the semiconductor wafer. OPC is a software algorithm that takes a set of input design data for a particular lithography step, transforms that input design data by applying a set of pre-determined algorithms and/or models, and finally outputs a new set of design data. This new set of design data is then used in writing or creating patterns in a physical medium such as a photo-mask.

At the center of the OPC technique is various models. The job of these models is to provide reasonably accurate prediction in the simulation world what will happen in the real world. Using these models, an OPC engine (or simulation software) will then provide corrections for errors found in the computational world and apply these corrections to the real world errors. In order to create a model that is suitable for OPC application, the first step is normally to put or lay features of known dimensions on a test mask. This test mask is then used to print and create a corresponding test wafer. During this process, each feature on the test mask needs to be measured because the mask manufacturing process is not always perfect and the features printed on the mask may deviate from what were intended to be printed. In the meantime, each feature on the test wafer needs to be measured as well. However, the measuring of these features usually takes a significant amount of time and has been known as a bottleneck of the OPC process. Based upon the measurement results from both the test mask and the test wafer, a model may be created that can then be used to predict the real world wafer shape for a given mask shape.

In reality, in order to provide relatively accurate prediction of the real world wafer shape, enough sample structures shall be test printed and measurement for each sample structure be made such that they represent as much, and as close, as possible to a full catalogue of geometries that may be included in any actual circuit designs. However, since the range of test structures is generally very large, not only is a large range of dimensions needed for each type of structures, but many different shapes of geometries are also needed to be test printed and their associated features be measured. It is always desirable to shorten the process of model calibration.

SUMMARY OF PREFERRED EMBODIMENTS

Embodiment of the present invention provides a method of calibrating a lithographic process model. The method includes providing a test pattern that includes a plurality of shapes; transferring the test pattern onto a photo-mask; forming a resist image of the test pattern using the photo-mask; collecting model calibration data from the resist image; and calibrating the lithographic process model using the model calibration data. In one aspect, the plurality of shapes of the test pattern have at least a first shape and a second shape, and distances from an edge of the first shape to an edge of the second shape over a range thereof, when being measured parallel to each other, differ from each other. In another aspect, a tangent to the edge of the first shape is not perpendicular to a tangent to the edge of the second shape. In yet another aspect, the distance measured above linearly increases or linearly decreases over a range of the edges of the first and second shapes, or changes in a parabolic form over the range of the edges of the first and second shapes.

According to embodiment of the present invention, the model calibration data is collected by a metrology technique to include at least a local maximum intensity ($I_{max}$), a local minimum intensity ($I_{min}$), a slope of intensity change, and a curvature or factor of light distribution. In one embodiment, the distance between the edges of the first and second shapes is short enough such that the local maximum intensity ($I_{max}$) and the local minimum intensity ($I_{min}$) affect the slope of intensity change.

According to one embodiment, the test pattern may include a plurality of shapes including at least a circle, or an elongated oval with a linearly changing width.

According to another embodiment, the plurality of shapes of the test pattern may include two elongated ovals with linearly changing width and being situated symmetrically around a third elongated oval, and includes two cycles being situated close to, but separated from, the two ends of the third elongated oval. In one aspect, each of the two elongated ovals has a width varying linearly and specifically from around 195 nm to around 92 nm, and a length around 1001 nm. In another aspect, the multiple shapes in the test pattern are spaced at least around 54 nm but no more than around 194 nm.

BRIEF DESCRIPTION OF THE DRAWINGS

The present invention will be understood and appreciated more fully from the following detailed description of the invention, taken in conjunction with the accompanying drawings of which.

Figure 1:
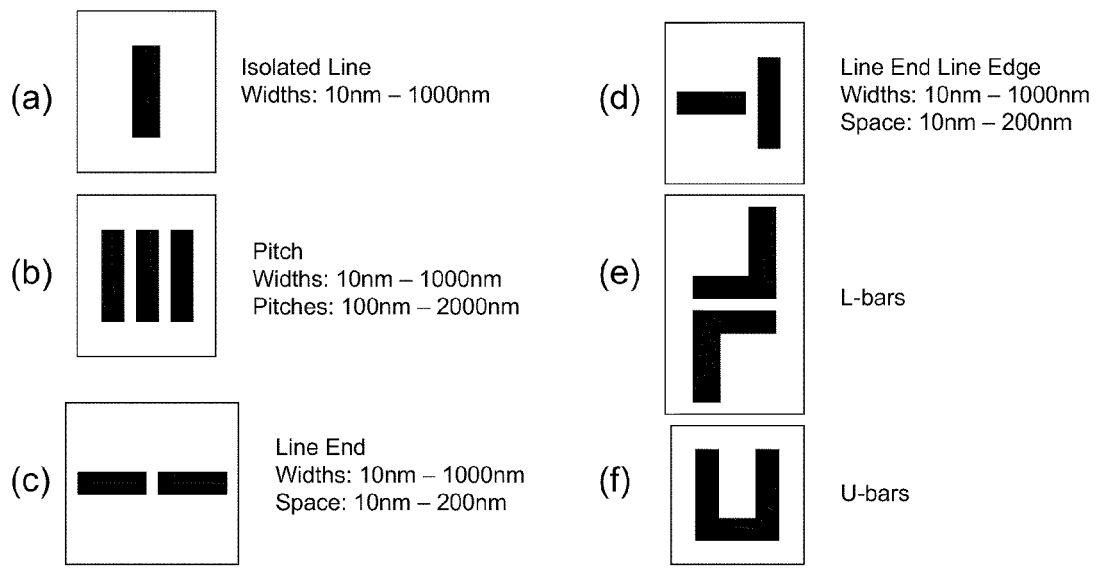
FIG. 1 is a simplified illustration of several test structures that are conventionally used to create data used in model calibration in optical proximity correction as is known in the art.

It will be appreciated that for simplicity and clarity of illustration, elements shown in the drawings have not necessarily been drawn to scale. For example, the dimensions of some of the elements may be exaggerated relative to other elements for clarity.

DETAILED DESCRIPTION OF THE EMBODIMENTS

In the following detailed description, numerous specific details are set forth in order to provide a thorough understanding of various embodiments of the invention. However, it will be understood by those of ordinary skill in the art that embodiments of the invention may be practiced without these specific details. In other instances, well-known methods and procedures may have not been described in detail in order not to obscure description of the various embodiments of the invention.

Certain portions of the detailed description in the following may be presented in terms of algorithms and symbolic representations of operations on electrical and/or electronic signals. These algorithmic descriptions are representations and may be the techniques used by those skilled in the electrical and electronic engineering and VLSI chip design to convey the substance of their work to others skilled in the art.

An algorithm is here, and generally, considered to be a self-consistent sequence of acts, actions, or operations leading to an expected or desired result. These include, but are not limited to, physical manipulation of physical quantities. Usually, though not necessarily, these quantities take the form of electrical or electronic signals capable of being stored, transferred, combined, compared, converted, and otherwise manipulated. It has proven convenient at times, principally for reasons of common usage, to refer to these signals as bits, values, elements, symbols, characters, terms numbers or the like. It shall be understood however that all of these and similar terms are to be associated with the appropriate physical quantities and are merely convenient labels applied to these quantities.

In the following description, various figures, diagrams, flowcharts, models, and descriptions are presented as different means to effectively convey the substances and illustrate different embodiments of the invention that are proposed in this application. It shall be understood by those skilled in the art that they are provided merely as exemplary samples, and shall not be constructed as limitation to the invention.

FIG. 1 is a simplified illustration of several test structures that are used to generate data, as is known in the art, which are then used in calibrating models used in optical proximity correction (OPC). These test structures may include, for example, a single isolated line (FIG. 1(a)) with a width of about 10 to 1000 nm, or multiple parallel lines (FIG. 1(b)) with about the same width and a pitch between the lines of about 100 to 2000 nm, or two lines separated by their ends (FIG. 1(c)) in a space of about 10 to 200 nm, or a line separated perpendicularly from the end of another line (FIG. 1(d)) with a space of about 10 to 200 nm, or two L-shaped bars separated in parallel along one set of the bars (FIG. 1(f), or a U-shape structure. It is to be noted that the above test structures, as well as other conventionally used test structures, are generally either parallel or perpendicular to each other, as being clearly shown in FIG. 1.

Figure 2:
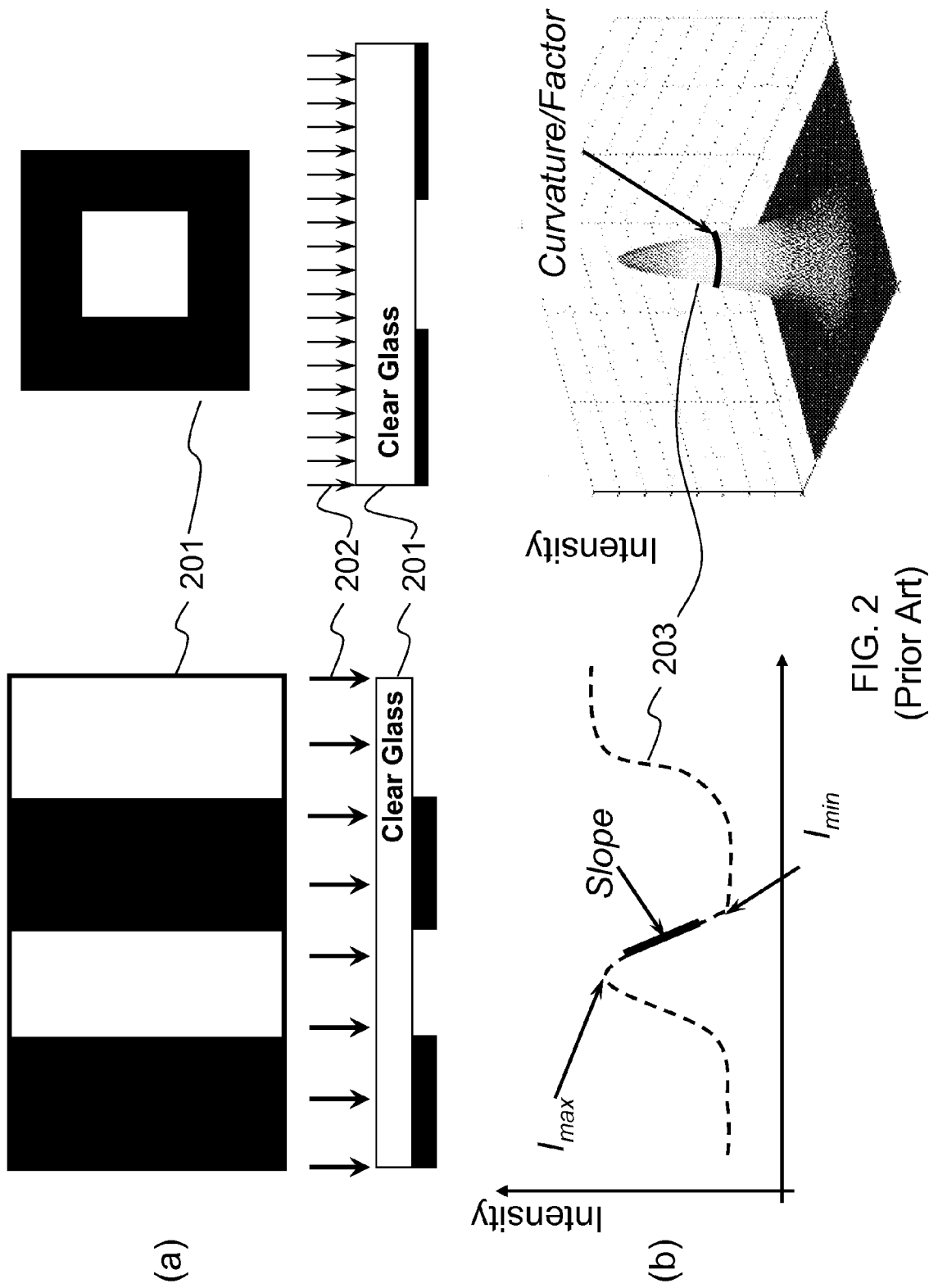
FIG. 2 is a demonstrative illustration of three key parameters in data collection used in model calibration as is known in the art.

FIG. 2 is a demonstrative illustration of some key parameters of data, as is known in the art, which are collected for model calibration in OPC. For example, FIG. 2(a) illustrates a top view of two different masks 201 that have certain structural shapes being imprinted thereupon. During a lithographic procedure of device making process, as is shown in FIG. 2(b), masks 201 may allow certain portions of light 202, which may be referred to hereinafter from time to time as an exposing light and is assumed as coming from above masks (or photo-masks) 201, to pass through masks 201 thereby causing selective exposure of a resist material that may be applied or coated on top of a semiconductor wafer (not shown) being placed underneath masks 201. Additionally, FIG. 2(b) illustrates a map of light intensity 203 that may reach the wafer, whose change may be caused due to exposing light 202 passing through the particular shape of masks 201.

By referring to FIG. 2(b), as is known in the art, four key exposure related parameters may be defined that includes, for example, a (locally) maximum light intensity $I_{max}$, a (locally) minimum light intensity $I_{min}$, a slope of change of intensity, and a curvature (or factor) of the light distribution which is measured in a plane perpendicular to the incident light. Generally speaking, if two structures (of a mask or different masks) have the same maximum and minimum light intensities $I_{max}$ and $I_{min}$, as well as the same slope of change of intensity and curvature or factor, then the two structures may be considered as being identical, from optical exposure standpoint as is known in the art, and for model calibration purpose only one set of data collection may be sufficient. Thus, in generating the required data set for model calibration, it may be possible to place only a limited number of combinations of certain test patterns or test structures in a test mask, transfer the test mask shape or pattern to a test wafer, and make measurement in both the mask and the wafer to perform data collection.

Despite the above, in order to create a reasonably accurate OPC model that can provide sufficient accuracy in predicting wafer images for manufacturing purpose, there is still a necessity to collect large number of data that will be able to cover a sufficient portion of a four-dimensional space represented by the four above described key parameters including $I_{max}$, $I_{min}$, slope of change of intensity, and curvature or factor of light distribution. Collection of these data through measurement on one or more test wafers, as is known in the art, usually demands a tremendous amount of time and effort, and has traditionally been known as a bottleneck of metrology. Here, the term "metrology" is used to describe making measurement of features from a wafer or multiple wafers.

Figure 3:
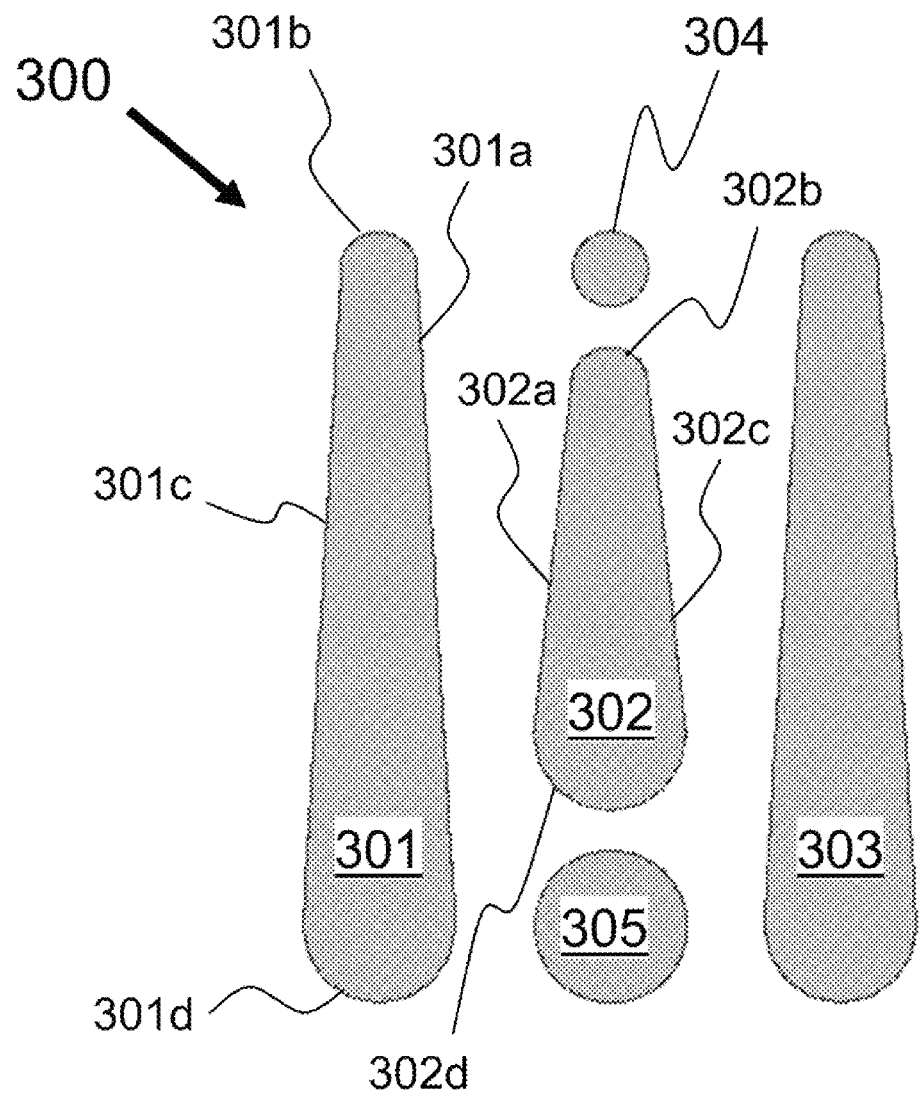
FIG. 3 is a demonstrative illustration of a test pattern for model calibration according to one embodiment of the present invention.

FIG. 3 is a demonstrative illustration of a test pattern according to one embodiment of the present invention. To generate data with improved efficiency for model calibration, one embodiment of the present invention provides a uniquely designed test pattern 300 as is shown in FIG. 3. Test pattern 300 may first be imprinted on a mask (or photo-mask) as a test structure, which is then transferred to a wafer, such as a semiconductor wafer although the present invention is not limited to semiconductor wafer, through an optical lithographic process. Images created in the semiconductor wafer may be measured efficiently through existing metrology and information such as data collected relating to the images created in the wafer may be used in calibrating models that are used in OPC.

More specifically, according to one embodiment of the present invention, test pattern 300 may include at least a first shape 301 and a second shape 302. First shape 301 may have a first edge 301a; a second edge 301b; a third edge 301c; and a fourth edge 301d. Second shape 302 may have, of its own, a first edge 302a; a second edge 302b; a third edge 302c; and a fourth edge 302d. First edge 301a (of first shape 301) and first edge 302a (of second shape 302) may be edges of straight lines, neighboring each other, and may neither be parallel nor perpendicular to each other. Furthermore, a distance from points along first edge 301a to points along first edge 302a, measured in parallel, may increase or decrease linearly. In other words, a derivative of the distance measured in parallel from points along first edge 301a to points along first edge 302a may be a constant.

According to another embodiment, second edge 301b of first shape 301 may be an arc with a first radius, and fourth edge 301d of first shape 301 may be an arc as well with a second radius wherein the second radius may be the same as, or larger than, the first radius. Third edge 301c of first shape 301 may be a straight line that is neither parallel nor perpendicular to first edge 301 a of first shape 301. However, third edge 301c may have a same length as that of first edge 301a and may be situated vertically symmetric to first edge 301a. First edge 301a, second edge 301b, third edge 301c, and fourth edge 301d may be connected in series and in sequence thereby forming the entire perimeter of first shape 301.

Similarly, second and fourth edges 302b and 302d of second shape 302 may be arcs of same or different radius, and third edge 302c of second shape 302 may be a straight line that is neither parallel nor perpendicular to first edge 302a of second shape 302. Third edge 302c may have the same length as that of first edge 302a and may be situated vertically symmetric to first edge 302a. In sequence, first edge 302a, second edge 302b, third edge 302c, and fourth edge 302d may be connected in series to form entire perimeter of second shape 302. Second shape 302 may be similar in style to first shape 301 except their relative dimensions. For example, second shape 302 may have a shorter height than first shape 301. In one embodiment, second shape 302 may be an elongated oval with a linearly changing width. In other words, the elongated oval may have one end that is narrower than the other end.

Test pattern 300 may additionally include a third shape 303 which may be similar in shape to first shape 301. For example, third shape 303 may be exactly the same in shape as first shape 301. Third shape 303 may be situated symmetric, relative to second shape 302, to first shape 301. In other words, second shape 302 may be situated in the middle or in the center between first shape 301 and third shape 303. Test pattern 300 may further include a fourth shape 304 and a fifth shape 305, both of which may be in a shape of circle and may be situated respectively at the upper and lower ends of second shape 302. For example, fifth shape 305 may be in a circle shape placed or situated at the lower end of second shape 302 having a radius that is same or larger than that of fourth shape 304 which is placed or situated at the upper end of second shape 302. In one embodiment, fourth shape 304 may have a radius that is the same as that of the arc of second edge 302b of second shape 302. In another embodiment, fifth shape 305 may have a radius that is the same as that of the arc of fourth edge 302d of second shape 302.

According to yet another embodiment, test pattern 300 may have a distance between neighboring edges of two neighboring shapes whose variation, when being measured in parallel at different points along respective edges of the two neighboring shapes, may be linear, as being described above, or may not be linear as being described below in more details. For example, a distance measured from first edge 301a of first shape 301, more specifically from a lower portion of first edge 301a to fourth edge 302d of second shape 302 may vary in a parabolic fashion. In other words, a first derivative of the distance, as being defined above, may change linearly and a second derivative of the same distance may be a constant. Similarly as is shown in FIG. 3, a distance measured from neighboring edges of neighboring shapes 302 and 305 may vary nonlinearly. Mathematically, a second derivative of that distance may be a constant.

Figure 4:
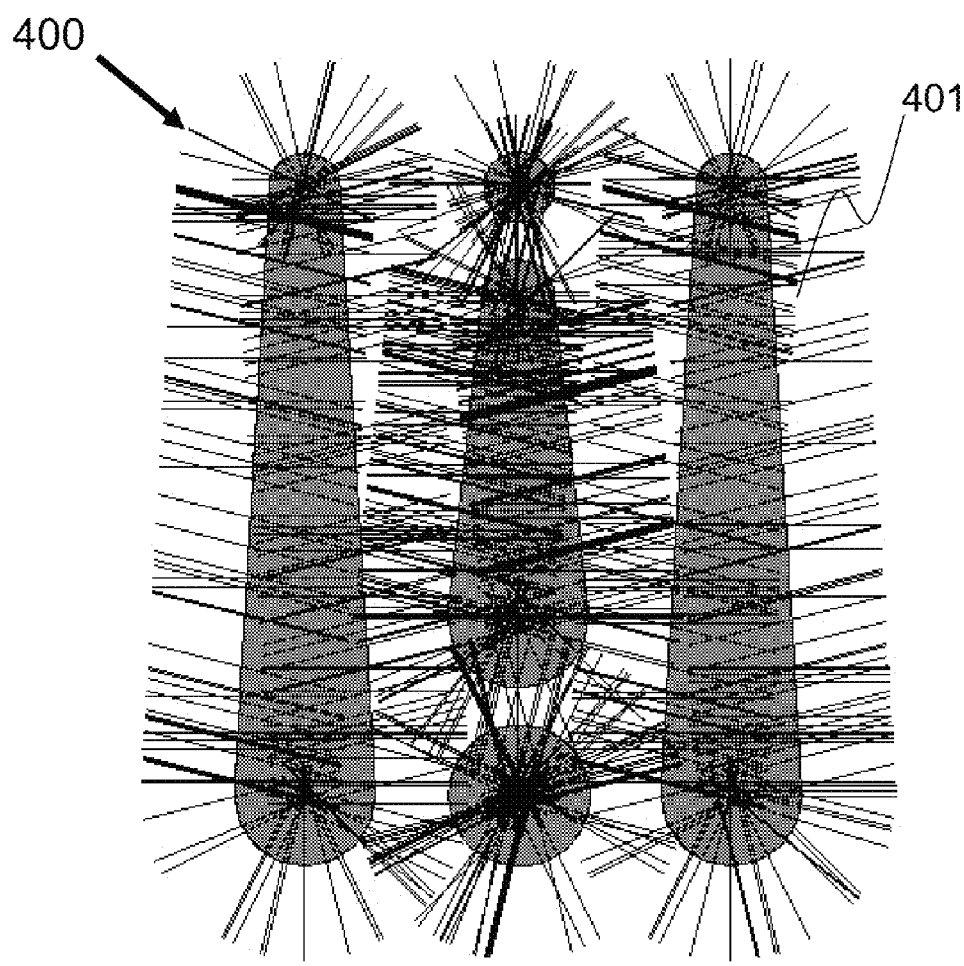
FIG. 4 is a demonstrative illustration of metrology measurement using the test pattern shown in FIG. 3 according to one embodiment of the present invention.

FIG. 4 is a demonstrative illustration of metrology measurement made on test pattern 300 shown in FIG. 3 according to one embodiment of the present invention. More specifically, using the existing metrology technique, measurement may be made along each and every "black" line 401 as being illustrated in FIG. 4 which results in measurement that involves situations of changing distance between neighboring shapes and between neighboring edges. According to embodiment of the present invention, the continuous change in distance, and the rate of change in distance (either being constant, linear, or nonlinear) may create unique situations where valuable information on different (locally) maximum and minimum light intensities, slope of change of intensity, and curvature, as being described above with reference to FIG. 2, may be obtained effectively and efficiently by the currently available metrology. The metrology time of collecting data from test pattern or test structure 300 shown in FIG. 3, which encompasses over 300 measurements, was about 30 seconds as in one instance being tested. In comparison, the time consumed by metrology to perform an equivalent number of measurements, in order to collect data from structures that are conventionally used as shown in FIG. 1 was about 1500 seconds in total, or 5 seconds for each measurement. In other words, test pattern or test structure 300 enables performing metrology measurement (on the same number of measurements) in about 2% of the time that is otherwise required if conventional test patterns or test structures are used.

Figure 5:
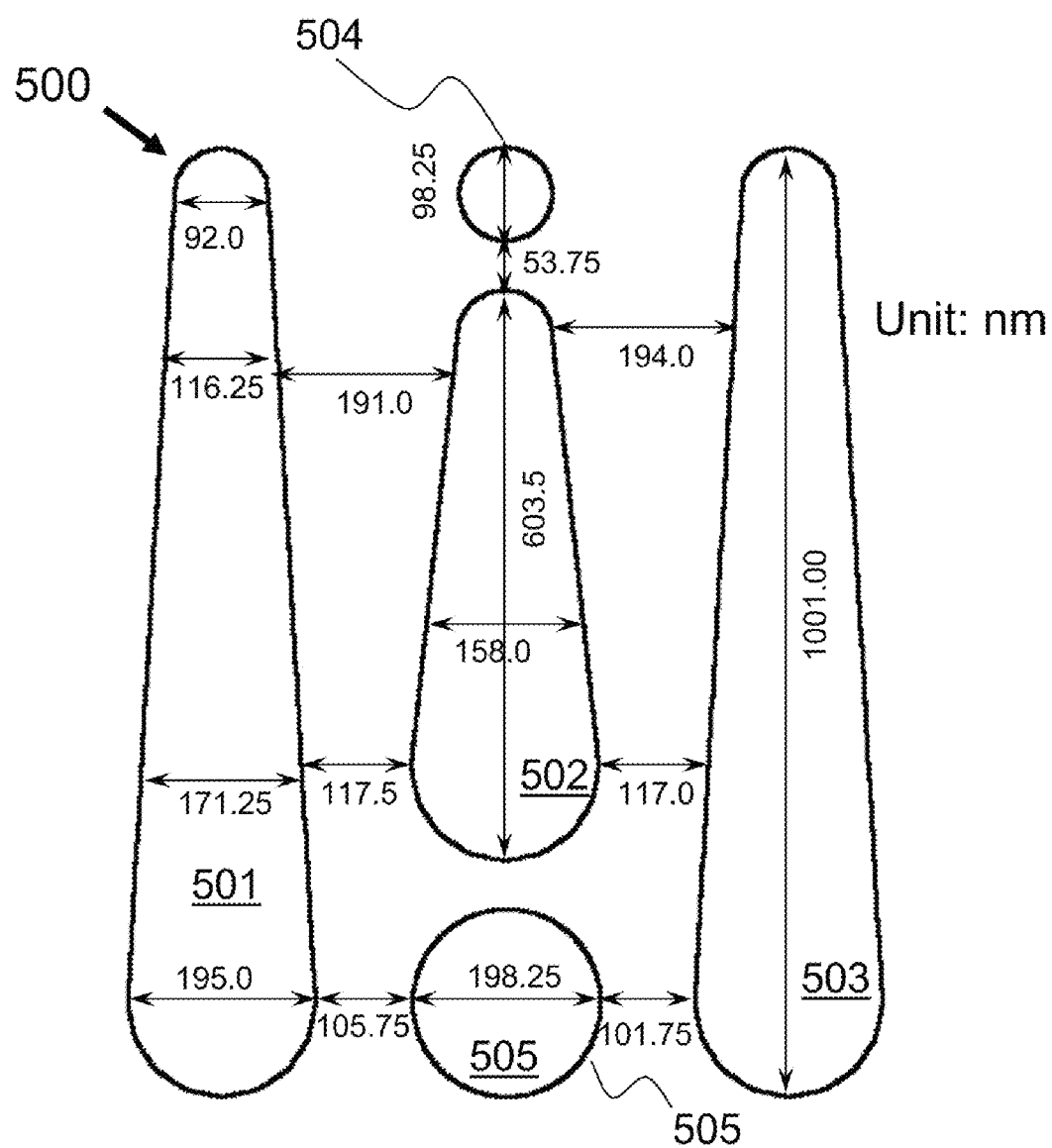
FIG. 5 is a demonstrative illustration of a test pattern for model calibration according to another embodiment of the present invention.

FIG. 5 is a demonstrative illustration of a specific test pattern for model calibration according to another embodiment of the present invention. For example, test pattern 500 may include first shape 501, second shape 502, third shape 503, fourth shape 504, and fifth shape 505. Test pattern 500 and its shapes 501-505 may be similar to test pattern 300 and its shapes 301-305 as shown in FIG. 3, and shapes 501-505 may have their representative dimensions as indicated in FIG. 5 in nanometers (nm) unit. For example, the two straight edges of first shape 501 may have a distance (i.e., width of first shape 501) varying from around 92 nm to around 195 nm; second shape 502 may have a height around 605.5 nm; third shape 503, which is similar to first shape 501 and situated symmetric around second shape 502, may have a height around 1001 nm; Fourth shape 504 is a circular with a diameter around 98.25 nm and fifth shape 505 is also a circular with a diameter around 198.25 nm. Spaces between various shapes vary from 53.75 nm (between second shape 502 and fourth shape 504) to 194 nm (between second shape 502 and first/third shape 501/503). With the above unique dimensional structure and combination of shapes, test pattern 500 may be able to produce a resist image that contains sufficient data, measurable through one metrology measurement, for performing OPC model calibration.

A person skilled in the art will appreciate that dimensions shown in FIG. 5 are typical values, representing only one of many possible embodiments of the present invention and other sizes of the shapes may be used as well. For example, a variation of dimension sizes, in a range up to about 20% from those indicated in FIG. 5, may be used as well to construct test patterns or test structures that are suitable for generating model calibration data. Moreover, additional circular shapes or shapes that are similar to shapes 501, 502 and 503 may be added to test pattern 500 in order to increase the range of image parameters that are collected by metrology using test pattern 500.

More generally, according to one embodiment of the present invention, a collection of shapes and/or test patterns may be designed and strategically placed, relative to each other, in a photo-mask such that the collection of shapes and/or test patterns, in its entirety, may yield or generate a substantially large amount of data, measured in metrology, that spans across a wide range of values of the four (4) parameters that characterize an optical image associated with the photo-mask including the (locally) maximum light intensity $I_{max}$, the (locally) minimum light intensity $I_{min}$, the slope of change of intensity, and the curvature (or factor) of the light distribution, to be used for model calibration. For example, the amount of data generated by the collection of shapes and/or test pattern that are created according to embodiment of the present invention is at least about ten (10) times, and maybe even fifty (50) times, more than that which would normally be generated by using the conventional test patterns as those being illustrated in FIG. 1.

Figure 6:
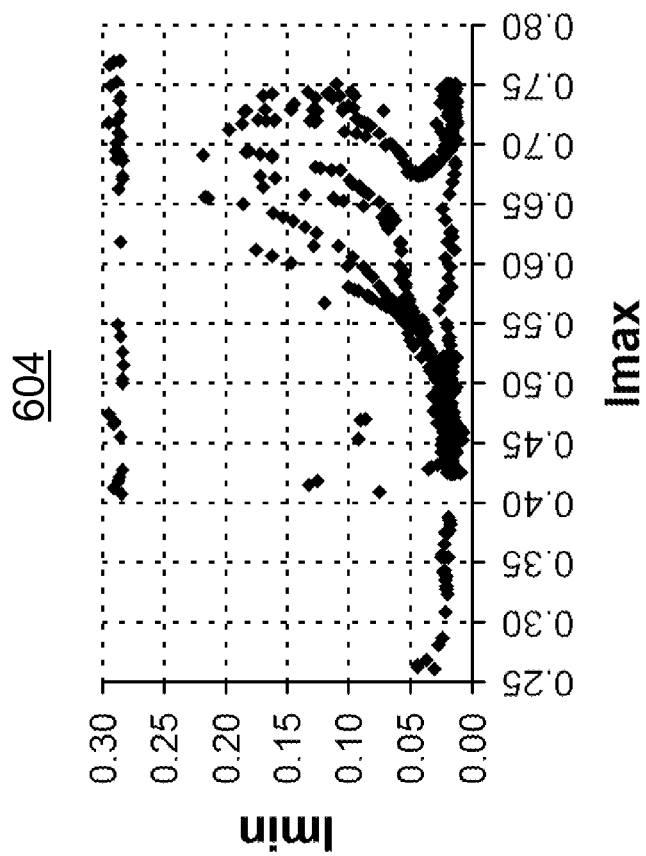
FIGS. 6(a), 6(b), and 6(c) are demonstrative illustrations of calibration data generated from a test pattern created according to one embodiment of the present invention.
Figure 6:
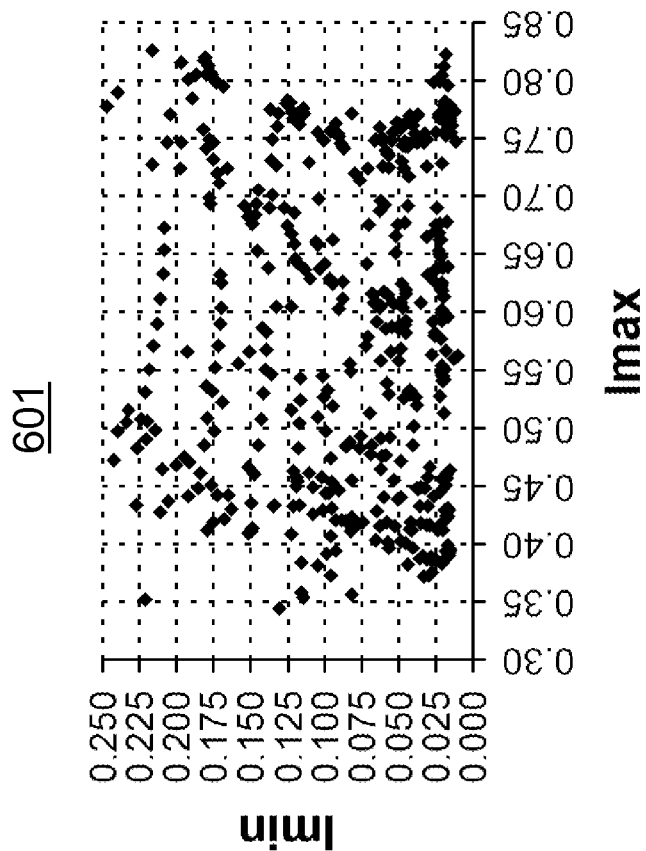
Figure 6B:
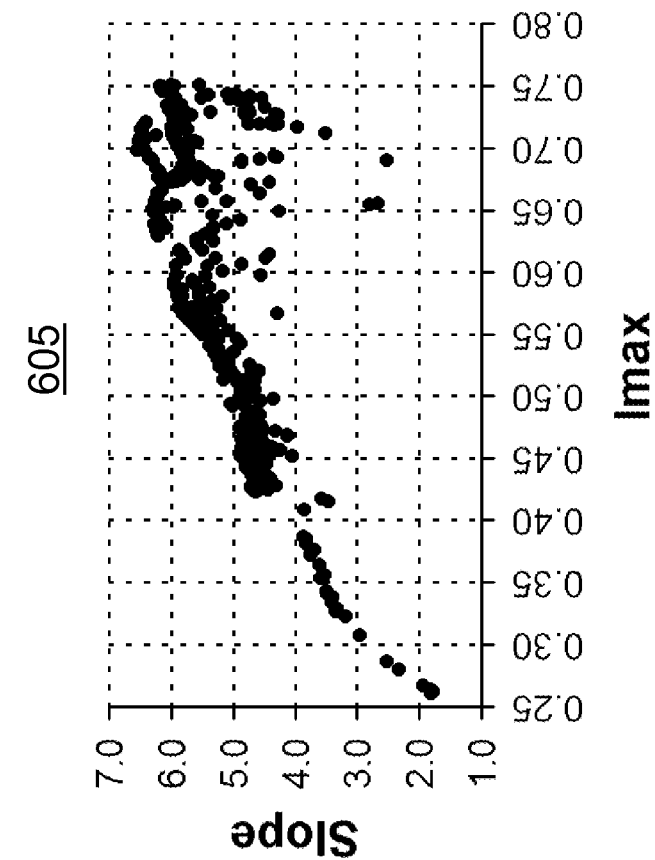
Figure 6B:
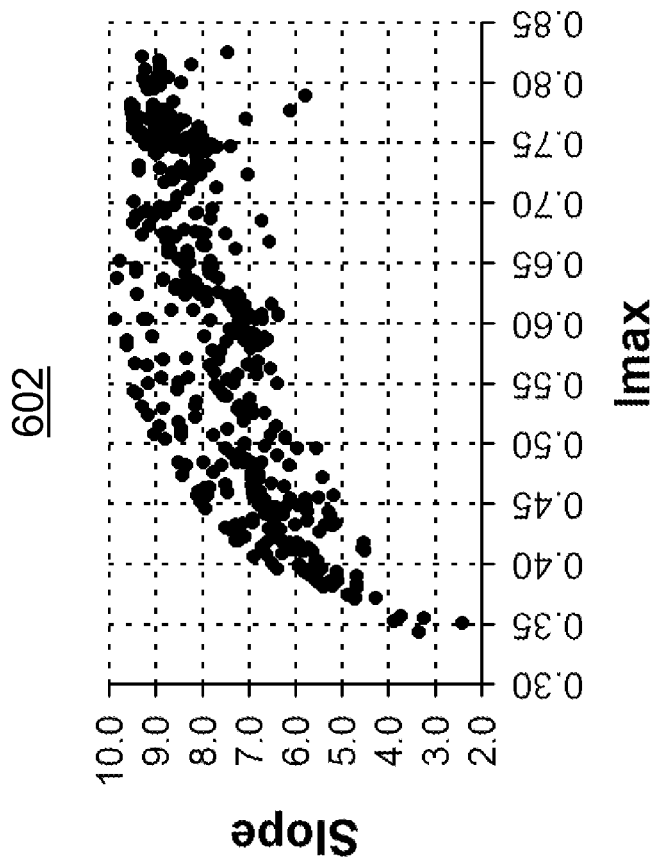
Figure 6C:
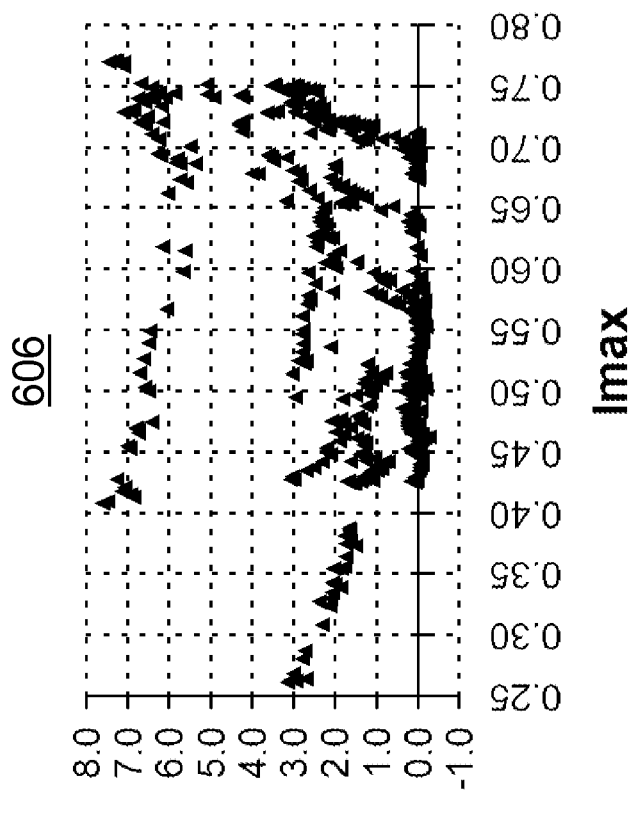
Figure 6C:
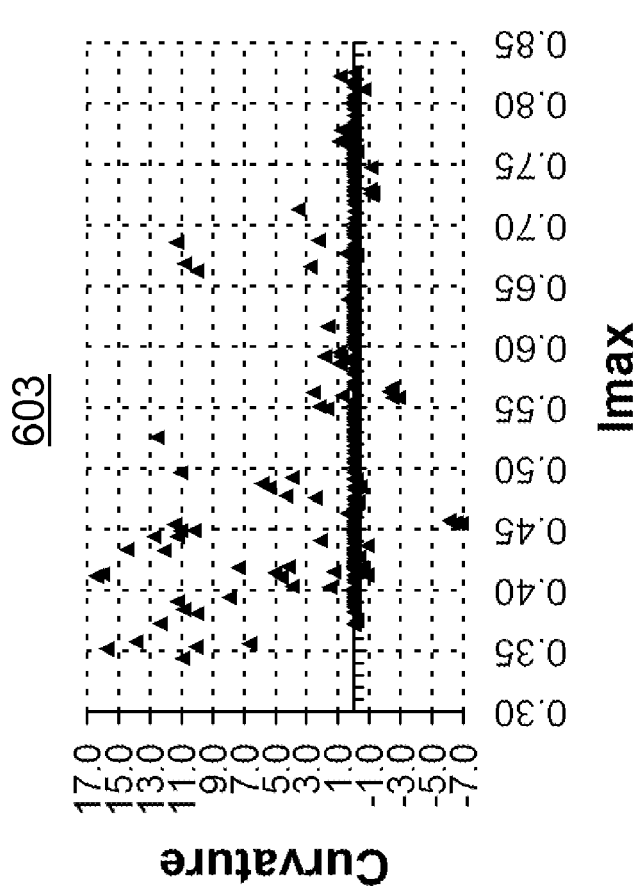

FIG. 6(a), FIG. 6(b), and FIG. 6(c) are demonstrative illustrations of model calibration data collected from both conventional test patterns and test patterns that are created according to embodiment of the present invention. Data collected from the conventional test patterns are shown as points in image parameter (IP) spaces, including $I_{min}$ versus $I_{max}$ (601 of FIG. 6(a)), slope versus $I_{max}$ (602 of FIG. 6(b)), and factor (curvature) versus $I_{max}$ (603 of FIG. 6(c)). Data points shown in plots 601, 602, and 603 are measured by metrology measurement over a large number, up to 700, of conventional test structures and they seem to have good coverage over their respective IP spaces. However, the large number of test structures that are used to generate the above data points represent significant time consumed in the metrology measurement, and therefore are often considered as a bottleneck for the metrology process. On the other hand, data points in plot 604 (of FIG. 6(a)), plot 605 (of FIG. 6(b)), and 606 (of FIG. 6(c)) demonstrate relatively good, if not equally good, coverage of their respective IP spaces, but yet they are generated from only one metrology measurement over one test pattern as being discussed above in detail with reference to FIG. 3 and FIG. 5. It shall be noted that further improvement of IP space coverage may be obtained by adding one or two additional shapes to the test structure, for example test structure 300 or test structure 500 created according to embodiments of the present invention, which will make the metrology far more efficient than that using conventional test structures.

Figure 7:
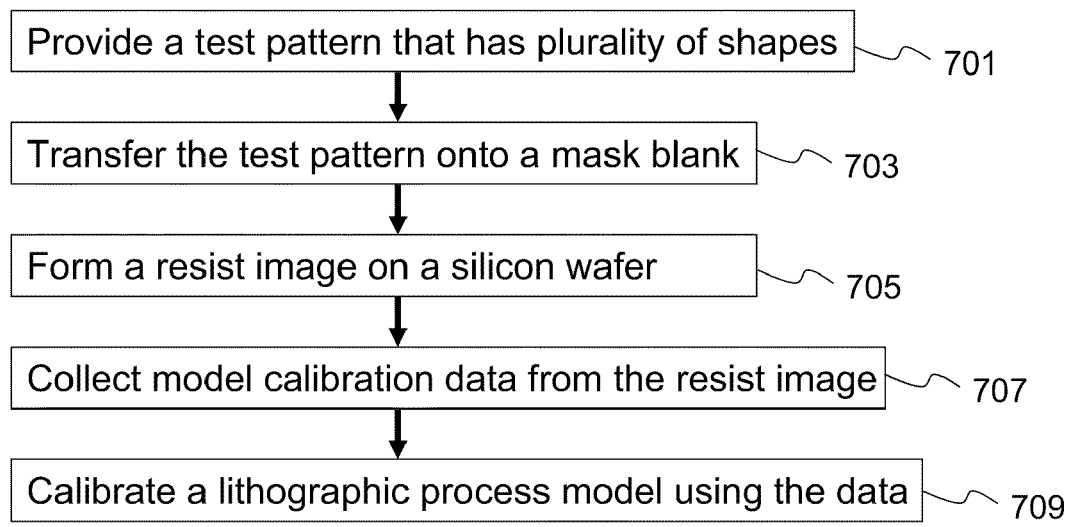
FIG. 7 is a demonstrative illustration of a method of making mask shape adjustment according to another embodiment of the present invention.

FIG. 7 is a demonstrative illustration of a method of making OPC model calibration according to one embodiment of the present invention. More specifically, one aspect of the embodiment may start with providing a test pattern that has plurality of shapes (701) such as those shown in FIG. 3 and FIG. 5. The shapes may have straight edges that are neither parallel nor perpendicular to each other, and may have a distance from respective points along edges of neighboring shapes, measured in parallel, that changes linearly or non-linearly such as in a parabolic fashion. According to embodiment of the invention, multiple shapes may be constructed using convergent/divergent and curved lines such as to create a single metrologically measurable structure from these multiple shapes, the image characteristics of which may span a desired parameter space comprised of $I_{min}$, $I_{max}$, slope, and curvature/factor. The method further includes transferring the constructed test pattern onto a mask (703) to create a photo-mask bearing the test pattern; and forming a photo-resist pattern or image on a wafer (705), such as a silicon wafer or semiconductor wafer in general, using the test pattern in the photo-mask. The method then performs data collection from the resist-patterns formed on the wafer (707) and uses the data collected to calibration various models used in optical approximate correction (OPC) (709).

Figure 8:
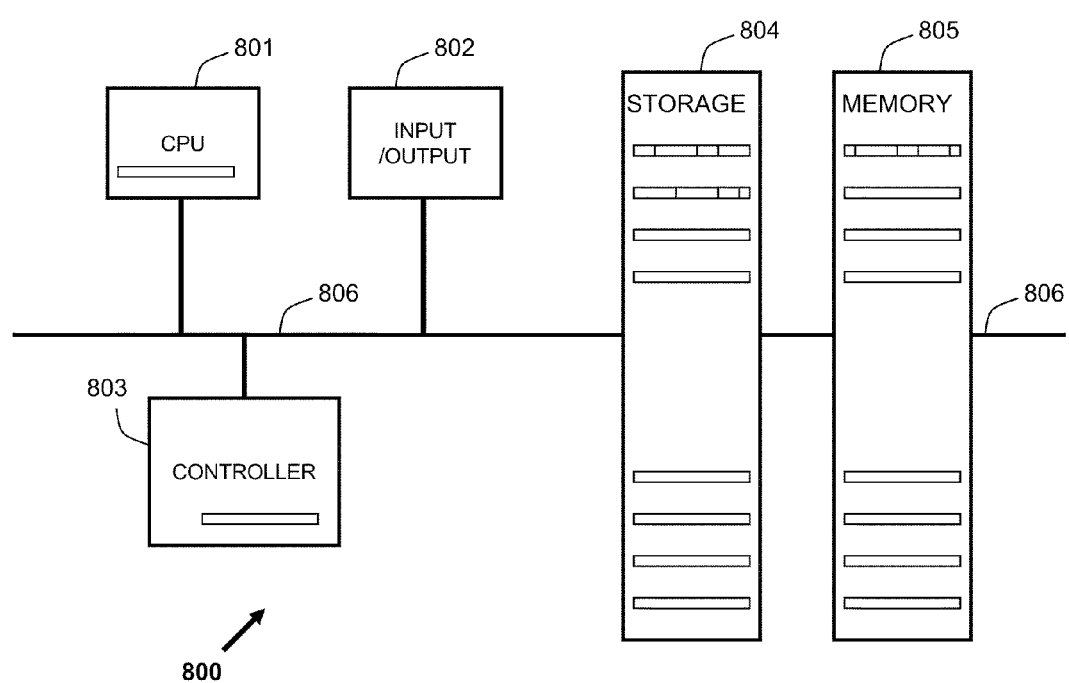
FIG. 8 is a demonstrative illustration of a computing system adapted to perform mask shape adjustment according to embodiments of the present invention.

Methods of creating test structure and making measurement of calibration data from the test structure according to embodiment of the present invention may be implemented in a machine, a computer, and/or a computing system or equipment. FIG. 8 is a simplified diagram illustration of a computing system 800 according to one embodiment of the present invention. Computing system or computer system 800 may include, inter alia, a central processing unit (CPU) 801 for data processing, at least one input/output (I/O) device 802 (such as a keyboard, a mouse, a compact disk (CD) drive, a display device, or a combination thereof or the like) for accepting instructions and/or input from an operator or user and outputting results from CPU processing data during simulation or computation, a controller 803 capable of controlling the operation of computing system 800, a storage device or medium 804 capable of reading and/or writing computer readable code, and a memory device or medium 805—all of which are operationally connected, e.g., by a bus or a wired or wireless communications network (806). Embodiments of the present invention may also be implemented as a computer program product stored on a computer readable medium such as storage device 804, or memory device 805, a tape or a compact disk (CD). The computer program product may contain instructions which may implement the method according to embodiments of the present invention on the computer system 800. Finally, the present invention can also be implemented in a plurality of distributed computers where the present items may reside in close physical proximity or distributed over a large geographic region and connected by a communication network.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of calibrating a lithographic process model, the method comprising:
   providing a test pattern that includes a plurality of shapes;
   transferring said test pattern onto a photo-mask;
   forming a resist image of said test pattern using said photo-mask through a photo-lithographic device;
   collecting model calibration data from said resist image; and
   calibrating said lithographic process model using said model calibration data,
   wherein at least one of said plurality of shapes is an elongated oval with a linearly changing width and said plurality of shapes is designed and strategically placed relative to each other such that said test pattern yields said model calibration data, measured in metrology, that spans across a wide range of values of four parameters, the four parameters characterize an optical image associated with said photo-mask.

2. The method of claim 1, wherein said plurality of shapes of said test pattern have at least a first shape and a second shape, and distances from an edge of said first shape to an edge of said second shape over a range of said edges of said first and second shapes, when being measured parallel to each other, differ from each other.

3. The method of claim 2, wherein a tangent to said edge of said first shape is not perpendicular to a tangent to said edge of said second shape.

4. The method of claim 2, wherein said distances linearly increase or linearly decrease over a range of said edges of said first and second shapes.

5. The method of claim 2, wherein said distances change in a parabolic form over a range of said edges of said first and second shapes.

6. The method of claim 5, wherein said model calibration data is collected by a metrology technique to include at least a local maximum intensity ($I_{max}$), a local minimum intensity ($I_{min}$), a slope of intensity change, and a curvature of light distribution.

7. The method of claim 6, wherein said distances between said edges of said first and second shapes are short enough such that said local maximum intensity ($I_{max}$) and said local minimum intensity ($I_{min}$) affect said slope of intensity change.

8. The method of claim 1, wherein at least one of said plurality of shapes is a circle.

9. The method of claim 1, wherein said plurality of shapes includes two elongated ovals with linearly changing width and being situated symmetrically around a third elongated oval, and includes two cycles being situated close to, but separated from, two ends of the third elongated oval.

10. The method of claim 9, wherein each of said two elongated ovals has a width varying linearly from around 195 nm to around 92 nm, and a length around 1001 nm.

11. The method of claim 9, wherein said plurality of shapes are spaced at least around 54 nm apart but no more than around 194 nm.

12. A system of making OPC model calibration, the system comprising:
   a central processing unit (CPU);
   at least one input/output device for interacting with a user of said system;
   at least one storage device for storing a set of instructions; and
   a controller for controlling said CPU; said at least one input/output device; and said at least one storage device via a communication bus,
   wherein said CPU is adapted to execute said set of instructions for:
     providing a test pattern that includes a plurality of shapes;
     transferring said test pattern onto a photo-mask;
     forming a resist image of said test pattern using said photo-mask;
     collecting model calibration data from said resist image; and
     calibrating said lithographic process model using said model calibration data,
     wherein said plurality of shapes of said test pattern have at least a first shape and a second shape, and distances from an edge of said first shape to an edge of said second shape over a range of said edges of said first and second shapes, when being measured parallel to each other, differ from each other and change in a parabolic form over a range of said edges of said first and second shapes.

13. The system of claim 12, wherein a tangent to said edge of said first shape is not perpendicular to a tangent to said edge of said second shape.

14. The system of claim 12, wherein said distances linearly increase or linearly decrease over another range of said edges of said first and second shapes.

15. The system of claim 12, wherein said plurality of shapes includes two elongated ovals with linearly changing width and being situated symmetrically around a third elongated oval, and includes two cycles being situated close to, but separated from, two ends of the third elongated oval.

16. The system of claim 15, wherein each of said two elongated ovals has a width varying linearly from around 195 nm to around 92 nm, and a length around 1001 nm.

17. The system of claim 15, wherein said plurality of shapes are spaced at least around 54 nm apart but no more than around 194 nm.

18. A machine-readable storage medium having stored thereon a set of instructions that, when executed by a machine, result in:
   providing a test pattern that includes a plurality of shapes;
   transferring said test pattern onto a photo-mask;
   forming a resist image of said test pattern using said photo-mask;
   collecting model calibration data from said resist image; and
   calibrating said lithographic process model using said model calibration data,
   wherein said plurality of shapes of said test pattern have at least a first shape and a second shape, and distances from an edge of said first shape to an edge of said second shape over a range of said edges of said first and second shapes, when being measured parallel to each other, differ from each other and wherein said plurality of shapes includes two elongated ovals with linearly changing width and being situated symmetrically around a third elongated oval, and includes two cycles being situated close to, but separated from, two ends of the third elongated oval.

19. The machine-readable storage medium of claim 18, wherein each of said two elongated ovals has a width varying linearly from around 195 nm to around 92 nm, and a length around 1001 nm.

20. The machine-readable storage medium of claim 18, wherein said plurality of shapes are spaced at least around 54 nm apart but no more than around 194 nm.

* * * * *

UNITED STATES PATENT AND TRADEMARK OFFICE
CERTIFICATE OF CORRECTION

PATENT NO. : 8,234,601 B2  
APPLICATION NO. : 12/780011  
DATED : July 31, 2012  
INVENTOR(S) : Amr Y. Abdo and Alexander C. Wei Page 1 of 1

It is certified that error appears in the above-identified patent and that said Letters Patent is hereby corrected as shown below:

Title page, item 75 change Inventors name from Amr A. Abdo to the correct name of: Amr Y. Abdo Signed and Sealed this  
Twenty-third Day of June, 2015

Michelle K. Lee  
*Director of the United States Patent and Trademark Office*